(12) United States Patent
Cheng et al.

(10) Patent No.: US 10,872,949 B2
(45) Date of Patent: Dec. 22, 2020

(54) DISPLAY PANEL AND DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/229,033

(22) Filed: Dec. 21, 2018

(65) Prior Publication Data
US 2019/0296098 A1 Sep. 26, 2019

(30) Foreign Application Priority Data
Mar. 22, 2018 (CN) .......................... 2018 1 0239662

(51) Int. Cl.
| | |
|---|---|
| *H01L 27/32* | (2006.01) |
| *H01L 27/15* | (2006.01) |
| *H01L 33/44* | (2010.01) |
| *H01L 33/62* | (2010.01) |
| *H01L 51/52* | (2006.01) |
| *H01L 33/06* | (2010.01) |

(52) U.S. Cl.
CPC ........ *H01L 27/3276* (2013.01); *H01L 27/156* (2013.01); *H01L 33/44* (2013.01); *H01L 33/62* (2013.01); *H01L 51/5253* (2013.01); *H01L 33/06* (2013.01); *H01L 2251/5338* (2013.01)

(58) Field of Classification Search
CPC ... H01L 27/3276; H01L 27/156; H01L 33/44; H01L 33/62; H01L 33/06; H01L 51/5253
See application file for complete search history.

(56) References Cited

U.S. PATENT DOCUMENTS

| | | | |
|---|---|---|---|
| 9,837,628 B2 | 12/2017 | Ma et al. | |
| 10,505,143 B2 | 12/2019 | Song et al. | |
| 2004/0183763 A1* | 9/2004 | Matsui | ............... G02F 1/136286 345/87 |
| 2012/0162053 A1* | 6/2012 | Lee | ..................... H01L 27/3279 345/80 |
| 2014/0264305 A1* | 9/2014 | Takahara | ............ H01L 27/3279 257/40 |

(Continued)

FOREIGN PATENT DOCUMENTS

| | | |
|---|---|---|
| CN | 102130300 A | 7/2011 |
| CN | 105185810 A | 12/2015 |
| CN | 105679795 A | 6/2016 |

OTHER PUBLICATIONS

Office Action dated Feb. 25, 2020 for corresponding application 201810239662.2 with English translation attached.

*Primary Examiner* — Christine A Enad
(74) *Attorney, Agent, or Firm* — Nath, Goldberg & Meyer; Joshua B. Goldberg

(57) ABSTRACT

The present disclosure provides a display panel and a display device. The display panel includes a power supply wiring layer on a base substrate and an encapsulation layer on a side of the power supply wiring layer distal to the base substrate. The power supply wiring layer and the encapsulation layer at least partially overlap, and a part of the power supply wiring layer overlapping with the encapsulation layer has an irregular structure for increasing a contact area between the power supply wiring layer and the encapsulation layer.

20 Claims, 3 Drawing Sheets

(56) References Cited

U.S. PATENT DOCUMENTS

| | | | |
|---|---|---|---|
| 2017/0359542 A1* | 12/2017 | Bairo | H01L 21/822 |
| 2018/0069072 A1* | 3/2018 | Kajiyama | H01L 51/5253 |
| 2018/0240834 A1* | 8/2018 | Tanaka | H01L 27/1469 |
| 2019/0043911 A1* | 2/2019 | Honda | H01L 27/14636 |
| 2019/0312096 A1* | 10/2019 | Na | H01L 27/3276 |

* cited by examiner

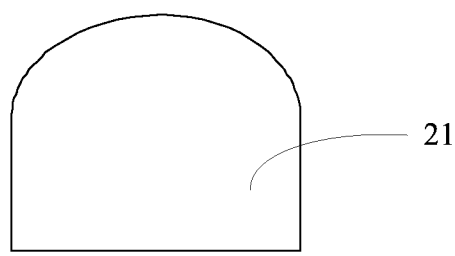
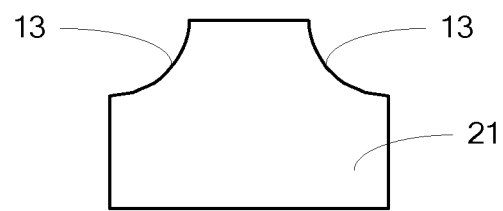
Fig. 5a
Fig. 5b
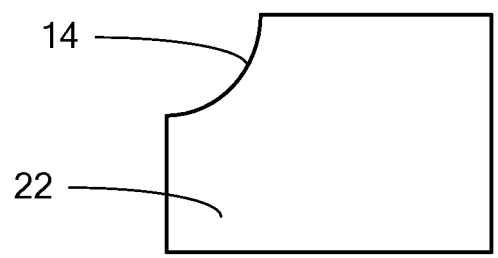
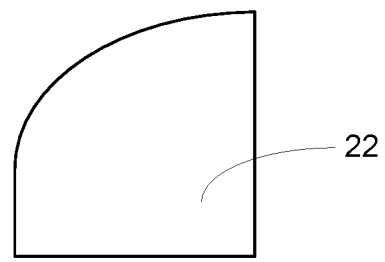
Fig. 6a
Fig. 6b

DISPLAY PANEL AND DISPLAY DEVICE

CROSS-REFERENCE TO RELATED APPLICATIONS

The present application claims the priority of Chinese Patent Application No. 201810239662.2, filed on Mar. 22, 2018, the contents of which are incorporated herein in their entirety by reference.

TECHNICAL FIELD

The present disclosure relates to the field of display technology, and in particular, relates to a display panel and a display device.

BACKGROUND

QLEDs (Quantum Dot Light Emitting Diodes) and OLEDs (Organic Light-Emitting Diodes) employ self-luminous technology which does not require extra light source, i.e., electroluminescent principle, to emit light. A flexible OLED display has various advantages like impact resistance, strong seismic capability, light weight, small volume, better portability and the like, and is a major future development trend.

SUMMARY

The present disclosure provides a display panel and a display device.

The present disclosure provides a display panel, including: a power supply wiring layer on a base substrate and an encapsulation layer on a side of the power supply wiring layer distal to the base substrate, wherein the power supply wiring layer and the encapsulation layer at least partially overlap, and a part of the power supply wiring layer overlapping with the encapsulation layer has an irregular structure for increasing a contact area between the power supply wiring layer and the encapsulation layer.

Optionally, the power supply wiring layer includes a power supply bonding wire in a peripheral region of the display panel, the power supply bonding wire at least partially overlaps with the encapsulation layer, and an orthographic projection of a part of the power supply bonding wire overlapping with the encapsulation layer on the base substrate has an outline at least partly having a nonlinear shape.

Optionally, the power supply wiring layer further includes a power supply bus in a peripheral region of the display panel and overlapping with the encapsulation layer, an outline of an orthographic projection of the power supply bus on the base substrate at least partly has a nonlinear shape.

Optionally, an outline of the orthographic projection of a part of the power supply bonding wire overlapping with the encapsulation layer on the base substrate is a curved line; and/or an outline of the orthographic projection of the power supply bus on the base substrate is a curved line.

Optionally, the nonlinear shape includes one or any combination of an arc shape, a fold-line shape, and a wave shape.

Optionally, the power supply bonding wire includes at least one of: a first protrusion on a side of the power supply bonding wire facing the encapsulation layer; and a first hollowed-out part in the power supply bonding wire.

Optionally, in a case where the power supply bonding wire includes the first protrusion, an orthographic projection of the first protrusion on the base substrate has one of: a circular shape, an elliptical shape, a square shape, a rectangular shape, and a diamond shape; and in a case where the power supply bonding wire includes the first hollowed-out part, an orthographic projection of the first hollowed-out part on the base substrate has one of: a circular shape, an elliptical shape, a square shape, a rectangular shape, and a diamond shape.

Optionally, in a case where the power supply bonding wire includes only the first protrusion, the power supply bonding wire includes a plurality of the first protrusions and the plurality of first protrusions are uniformly distributed; in a case where the power supply bonding wire includes only the first hollowed-out part, the power supply bonding wire includes a plurality of the first hollowed-out parts and the plurality of first hollowed-out parts are uniformly distributed; and in a case where the power supply bonding wire includes the first protrusion and the first hollowed-out part, the first protrusion and the first hollowed-out part are uniformly distributed.

Optionally, in a case where the power supply bonding wire includes the first protrusion, the first protrusion and the power supply bonding wire are formed of a same material.

Optionally, the power supply bus includes at least one of: a second protrusion on a side of the power supply bus facing the encapsulation layer; and a second hollowed-out part in the power supply bus.

Optionally, in a case where the power supply bus includes the second protrusion, an orthographic projection of the second protrusion on the base substrate has one of: a circular shape, an elliptical shape, a square shape, a rectangular shape, and a diamond shape; and in a case where the power supply bus includes the second hollowed-out part, the second hollowed-out part has one of: a circular shape, an elliptical shape, a square shape, a rectangular shape, and a diamond shape.

Optionally, in a case where the power supply bus includes only the second protrusion, the power supply bus includes a plurality of the second protrusions and the plurality of second protrusions are uniformly distributed; in a case where the power supply bus includes only the second hollowed-out part, the power supply bus includes a plurality of the second hollowed-out parts and the plurality of second hollowed-out parts are uniformly distributed; and in a case where the power supply bus includes the second protrusion and the second hollowed-out part, the second protrusion and the second hollowed-out part are uniformly distributed.

Optionally, in a case where the power supply bus includes the second protrusion, the second protrusion and the power supply bus are formed of a same material.

Optionally, a surface of the power supply bonding wire in contact with the encapsulation layer is at least partly a curved surface.

Optionally, a surface of the power supply bus in contact with the encapsulation layer is at least partly a curved surface.

Optionally, an entirety of an outline of an orthographic projection of the power supply bonding wire on the base substrate has a continuous nonlinear shape.

Optionally, the power supply wiring layer further includes a power supply wire in a display region of the display panel and overlapping with the encapsulation layer, and a third hollowed-out part is provided in the power supply wire.

Optionally, an edge, close to the peripheral region of the display panel, of the orthographic projection of the power supply bus on the base substrate has a wave shape.

Optionally, an edge, close to a display region of the display panel, of the orthographic projection of the power supply bus on the base substrate has a wave shape.

The present disclosure provides a display device, including the display panel described above.

Optionally, the display panel is an OLED display panel or a QLED display panel.

BRIEF DESCRIPTION OF THE DRAWINGS

FIGS. 5a to 5b are cross-sectional views of a power supply bonding wire taken alone line a-a' in FIGS. 2 to 4; and FIGS. 6a to 6b are cross-sectional views of a power supply bus taken along line b-b' in FIG. 4.

DETAILED DESCRIPTION

Technical solutions of the present disclosure will be described clearly and fully below in conjunction with the accompanying drawings of the present disclosure. Obviously, the described embodiments are part of embodiments of the present disclosure, rather than all of the embodiments. Based on the embodiments of the present disclosure, all other embodiments obtained by an ordinary person skilled in the art without any inventive effort fall within the protection scope of the present disclosure.

Figure 1:
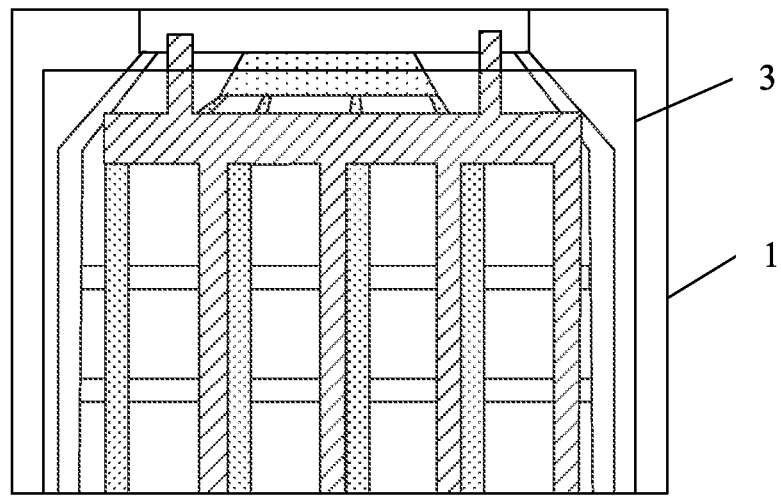
FIG. 1 is a schematic structural diagram of a conventional display panel after encapsulation.

In a QLED panel and an OLED panel, in order to prevent intrusion of water and oxygen, generally, the QLED panel and the OLED panel are thin film encapsulated using an encapsulation layer 3, as shown in FIG. 1. However, the encapsulation layer 3 is very likely to be stripped and fall off from a layer structure on a base substrate 1 during bending, thereby resulting in failure of encapsulation and display defect.

Figure 2:
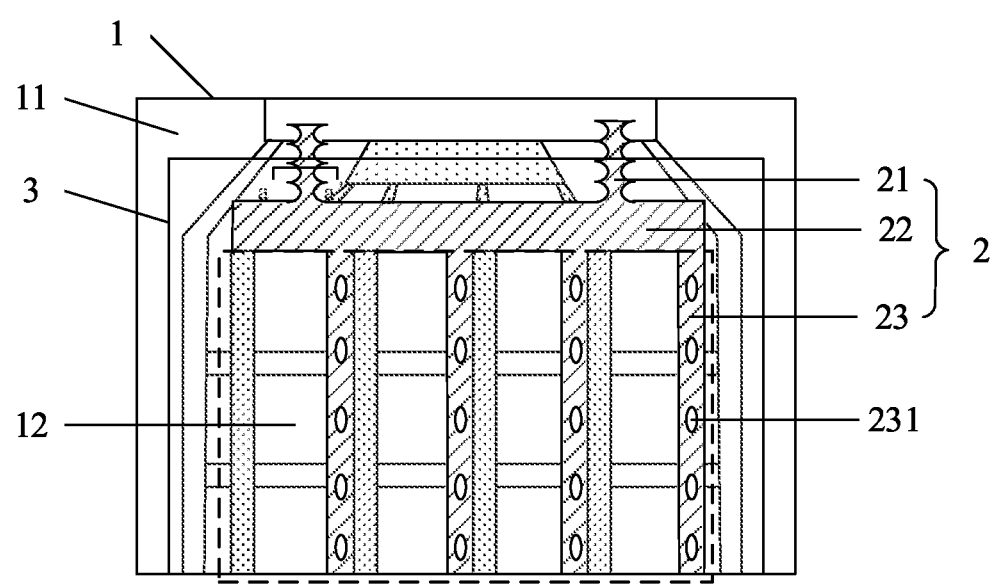
FIG. 2 is a schematic structural diagram of a display panel according to an embodiment of the present disclosure.

In view of the above problem, the present disclosure provides a display panel. FIG. 2 is a schematic structural diagram of the display panel according to an embodiment of the present disclosure. As shown in FIG. 2, the display panel includes a power supply wiring layer 2 formed on a base substrate 1, and an encapsulation layer 3 disposed at a side of the power supply wiring layer 2 distal to the base substrate 1. The power supply wiring layer 2 and the encapsulation layer 3 at least partially overlap, and a part of the power supply wiring layer 2 overlapping with the encapsulation layer 3 is formed to have an irregular structure for increasing a contact area between the power supply wiring layer 2 and the encapsulation layer 3. In this way, in the process of encapsulating the display panel, an attaching force between the encapsulation layer 3 and the power supply wiring layer 2 can be increased, preventing display defect caused by cracking of film layers and falling off of the encapsulation layer 3 during bending of the display panel.

It is to be noted that, in this description, "the power supply wiring layer and the encapsulation layer at least partially overlap" means that an orthographic projection of the power supply wiring layer on the base substrate at least partially overlaps with an orthographic projection of the encapsulation layer on the base substrate. Further, the "irregular structure" described herein includes a layer structure having a non-planar surface or a layer structure having a through hole, which is not specifically limited in the present disclosure, as long as a surface area of the irregular structure is increased relative to a layer structure having a continuous plane.

In some embodiments, the encapsulation layer 3 includes an inorganic encapsulation layer made of a water and oxygen blocking material such as silicon nitride or silicon oxide.

The display panel includes an AA region (i.e. display region) 12 and a peripheral region 11 surrounding the AA region. In FIG. 2, inside the dashed line box is the AA region 12 of the display panel, outside the dashed line box is the peripheral region 11 of the display panel. According to an embodiment of the present disclosure, the power supply wiring layer 2 includes a power supply bonding wire 21, which is located in the peripheral region 11 of the display panel and at least partially overlaps with the encapsulation layer 3. An orthographic projection of a part of the power supply bonding wire 21 overlapping with the encapsulation layer 3 on the base substrate 1 has an edge (or outline) at least partly having a nonlinear shape.

Because the edge of the orthographic projection of the power supply bonding wire 21 on the base substrate 1 at least partly has a nonlinear shape, an attaching force between the power supply bonding wire 21 and the encapsulation layer 3 can be increased. Specifically, an edge of the power supply bonding wire 21 has a nonlinear irregular shape, which can increase a contact area between the power supply bonding wire 21 and the encapsulation layer 3, making the power supply bonding wire 21 and the encapsulation layer 3 more firmly connected.

The display panel according to the present disclosure includes the power supply wiring layer 2 formed on the base substrate 1, and the encapsulation layer 3 disposed at a side of the power supply wiring layer 2 distal to the base substrate 1, the power supply wiring layer 2 includes the power supply bonding wire 21, which is located in the peripheral region 11 of the display panel and at least partially overlaps with the encapsulation layer 3, an orthographic projection of a part of the power supply bonding wire 21 overlapping with the encapsulation layer 3 on the base substrate 1 has an edge at least partly having a nonlinear shape. As such, in the process of encapsulating the display panel, a contact area between the encapsulation layer 3 and the power supply bonding wire 21 can be increased, and an attaching force therebetween can be increased, preventing display defect caused by cracking of film layers and falling off of the encapsulation layer 3 during bending of the display panel.

Optionally, the edge of the orthographic projection of the power supply bonding wire 21 on the base substrate 1 entirely has a nonlinear shape. Optionally, the edge of the orthographic projection of the power supply bonding wire 21 on the base substrate 1 entirely has a continuous nonlinear shape. This can further increase the contact area of the encapsulation layer 3 and the power supply bonding wire 21, and further increase the attaching force between the encapsulation layer 3 and the power supply bonding wire 21, preventing cracking of film layers and falling off of the encapsulation layer 3.

Optionally, the nonlinear shape may include one or any combination of the following shapes: an arc shape, a fold line shape, and a wave shape.

It is to be noted that, in an embodiment of the present disclosure, if the edges (i.e., the edges parallel to the extending direction of the power supply bonding wire 21) at both sides of the orthographic projection of the power supply bonding wire 21 on the base substrate 1 both have a continuous nonlinear shape, the attaching force between the encapsulation layer 3 and the power supply bonding wire 21 can be maximized Needless to say, it would be appreciated by one skilled in the art that, the edges of the orthographic projection of the power supply bonding wire 21 on the base substrate 1 may also be formed as follows: the edge at one side has a continuous nonlinear shape, and the edge at the other side still has a linear shape, which can as well increase the attaching force between the encapsulation layer 3 and the power supply bonding wire 21.

In order to further increase the attaching force between the power supply bonding wire 21 and the encapsulation layer 3, further, a surface of the power supply bonding wire 21 in contact with the encapsulation layer 3 at least partly is a curved surface. FIGS. 5a to 5b are schematic cross-sectional views of the power supply bonding wire taken along line a-a' in FIG. 2. Optionally, as shown in FIG. 5a, a surface of the power supply bonding wire 21 close to the encapsulation layer 3 includes a first curved surface 13, which is curved inwardly, that is, the first curved surface 13 is depressed towards a direction away from the encapsulation layer 3. As such, when coating a material of the encapsulation layer, the material of the encapsulation layer can remain at the position of the first curved surface 13, thereby further increasing the attaching force between the encapsulation layer 3 and the power supply bonding wire 21. Optionally, as shown in FIG. 5b, the surface of the power supply bonding wire 21 in contact with the encapsulation layer 3 is a curved surface as a whole, the curved surface protruding towards a direction approaching the encapsulation layer 3.

Further, as shown in FIG. 2, the power supply wiring layer 2 may also include a power supply bus 22, which is located in the peripheral region 11 and overlaps with the encapsulation layer 3, an edge of an orthographic projection of the power supply bus 22 on the base substrate 1 may be a straight line or a curved line. In the embodiment shown in FIG. 2, the edge of the orthographic projection of the power supply bus 22 on the base substrate 1 is a straight line.

Further, as shown in FIG. 2, the power supply wiring layer 2 may also include a power supply wire 23, which is located in the display region 12 and overlaps with the encapsulation layer 3, and on the power supply wire 23 there may be disposed a third hollowed-out part 231, which is beneficial to bending of the display panel, preventing the power supply wire 23 from being broken during bending of the display panel.

In an embodiment of the present disclosure, the power supply wiring layer 2 is an electrode layer configured to input an anode signal from an external IC to a pixel circuit, and correspondingly, the power supply bonding wire 21 is a power supply bonding wire configured to input a voltage to the pixel circuit. It is to be noted that, the power supply bonding wire 21, the power supply bus 22 and the power supply wire 23 are connected to one another, and together constitute the power supply wiring layer 2. In the AA region 12 of the display panel, layer structures such as source and drain metal layers, a gate metal layer or a GOA electrode layer and the like are also disposed, which is not described in detail here.

Figure 3:
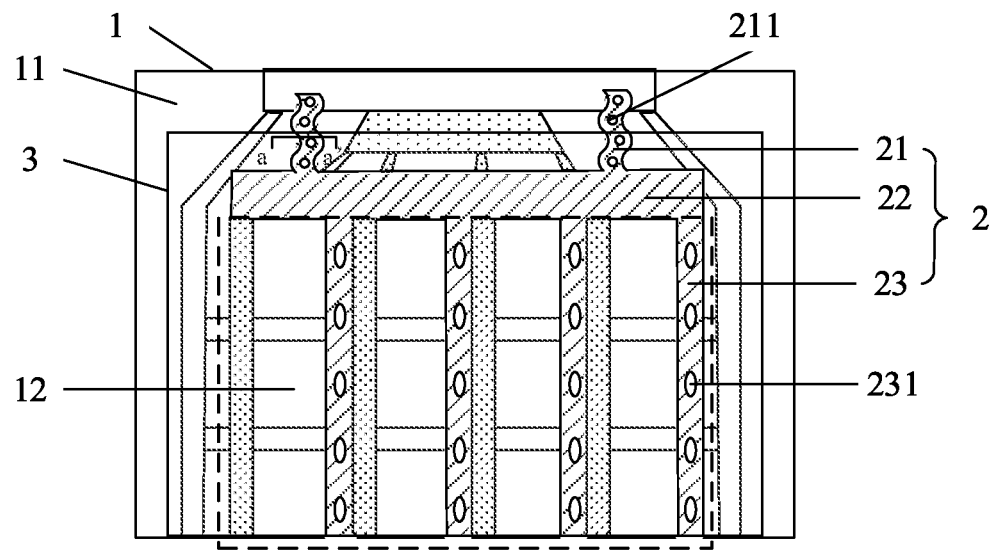
FIG. 3 is a schematic structural diagram of a display panel according to an embodiment of the present disclosure.

FIG. 3 is a schematic structural diagram of a display panel according to another embodiment of the present disclosure. This display panel differs from the display panel of the above embodiments in that, in the display panel of the present embodiment, a first protrusion and/or a first hollowed-out part 211 are also provided on the power supply bonding wire 21, and a part of the power supply bonding wire 21 overlapping with the encapsulation layer 3 has a different shape.

Specifically, as shown in FIG. 3, a first protrusion 211 is disposed on a side of the power supply bonding wire 21 facing the encapsulation layer 3, and/or a first hollowed-out part 211 is disposed on the power supply bonding wire 21. It is to be noted that, in this description, the first protrusion and the first hollowed-out part are both denoted by the reference sign 211, but they are two independent structures. Optionally, there may be a plurality of the first protrusions and/or a plurality of first hollowed-out parts 211, and the first protrusions and/or the first hollowed-out parts 211 are uniformly distributed, and at least partially overlap with the encapsulation layer 3.

In an embodiment, an orthographic projection of the first protrusion 211 on the base substrate 1 has a circular shape or an elliptical shape, and/or the first hollowed-out part 211 has a circular shape or an elliptical shape. Needless to say, the orthographic projection of the first protrusion on the base substrate and/or the first hollowed-out part may also have other shapes such as a square shape, a rectangular shape, a diamond shape and the like.

In an embodiment, there are a plurality of the first protrusions uniformly distributed and/or a plurality of first hollowed-out parts uniformly distributed. When there are a plurality of the first protrusions uniformly distributed, and/or a plurality of first hollowed-out parts uniformly distributed, the contact area of the encapsulation layer 3 and the power supply bonding wire 21 can be further increased, and the attaching force therebetween can be further increased. Optionally, the first protrusion 211 and the power supply bonding wire 21 may be formed of a same material, as such, the first protrusion 211 may be formed in the same step as the power supply bonding wire 21, thereby saving fabrication steps.

In the display panel of the present embodiment, since there are also the first protrusion and/or the first hollowed-out part 211 provided on the power supply bonding wire 21, at the position(s) of the first protrusion and/or the first hollowed-out part 211, the contact area of the power supply bonding wire 21 and the encapsulation layer 3 can be further increased, increasing the attaching force therebetween, and preventing cracking of film layers.

In an embodiment, as shown in FIG. 3, an orthographic projection of a part of the power supply bonding wire 21 overlapping with the encapsulation layer 3 on the base substrate 1 has an edge which is a curved line. Optionally, the edge of the orthographic projection of the part of the power supply bonding wire 21 overlapping with the encapsulation layer 3 on the base substrate 1 is a curved line having a wave shape.

In the display panel of the present embodiment, since the edge of the orthographic projection of the part of the power supply bonding wire 21 overlapping with the encapsulation layer 3 on the base substrate 1 is a wave-shaped curved line without any sharp angle, short circuit between conducive wires due to point discharge can be prevented.

Other structures of the display panel of the present embodiment are the same as those of the display panel of the above-described embodiments, which are not described in detail here.

Figure 4:
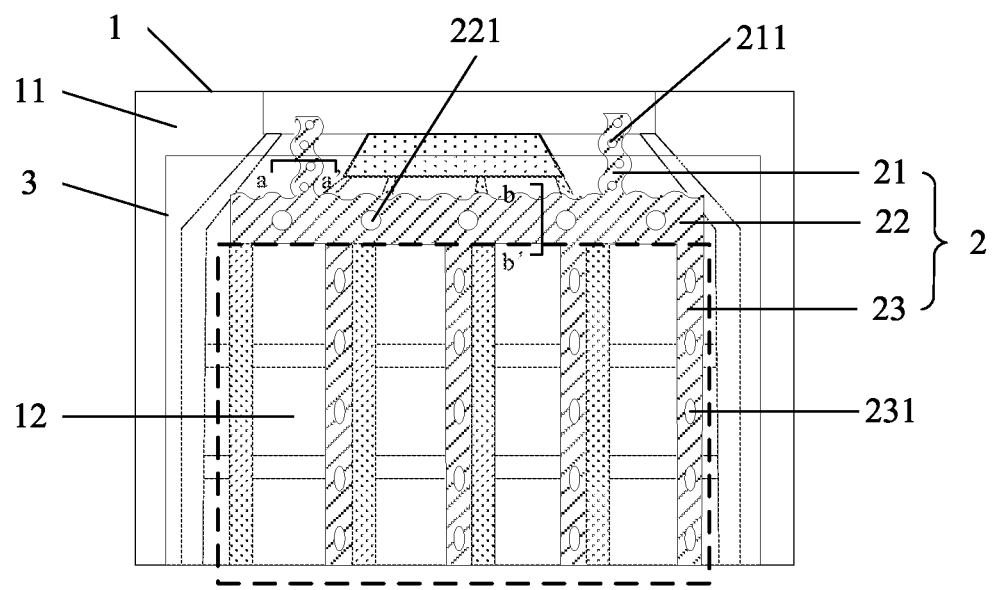
FIG. 4 is a schematic structural diagram of a display panel according to an embodiment of the present disclosure.

FIG. 4 is a schematic structural diagram of a display panel according to another embodiment of the present disclosure. The display panel according to the present embodiment differs from the display panel of the above embodiments in that, in the display panel of the present embodiment, a second protrusion and/or a second hollowed-out part 221 are provided on the power supply bus 22, and the power supply bus 22 has a different shape.

In an embodiment, as shown in FIG. 4, a second protrusion 221 is disposed at a side of the power supply bus 22 facing the encapsulation layer 3, and/or a second hollowed-out part 221 is disposed on the power supply bus 22. It is to be noted that, in this description, the second protrusion and the second hollowed-out part are both denoted by the reference sign 221, but they are two independent structures. Optionally, there may be a plurality of the second protrusions and/or a plurality of the second hollowed-out parts 221, and the second protrusions and/or the second hollowed-out parts 221 are each uniformly distributed, and at least partially overlap with the encapsulation layer 3.

In an embodiment, an orthographic projection of the second protrusion 221 on the base substrate 1 has a circular shape or an elliptical shape, and/or the second hollowed-out part 221 has a circular shape or an elliptical shape. Needless to say, the orthographic projection of the second protrusion on the base substrate and/or the second hollowed-out part may also have other shapes such as a square shape, a rectangular shape, a diamond shape and the like.

Optionally, there are a plurality of the second protrusions uniformly distributed and/or a plurality of second hollowed-out parts uniformly distributed. When there are a plurality of the second protrusions uniformly distributed and/or a plurality of second hollowed-out parts uniformly distributed, the contact area of the encapsulation layer 3 and the power supply bus 22 can be further increased, and the attaching force therebetween can be further increased.

In an embodiment, the second protrusion 221 and the power supply bus 22 may be formed of a same material, as such, the second protrusion 221 may be formed in the same step as the power supply bus 22, thereby saving fabrication steps.

As shown in FIG. 4, an orthographic projection of the power supply bus 22 on the base substrate 1 has an edge which at least partly has a nonlinear shape. Optionally, the edge of the orthographic projection of the power supply bus 22 on the base substrate 1 entirely has a nonlinear shape. The nonlinear shape may include one or any combination of the following shapes: an arc shape, a fold-line shape, and a wave shape. Optionally, the edge of the orthographic projection of the power supply bus 22 on the base substrate 1 is a curved line. In the embodiment of the present disclosure, as shown in FIG. 4, the edge of the orthographic projection of the power supply bus 22 on the base substrate 1 has a wave shape, and as such, the attaching force between the encapsulation layer 3 and the power supply bus 22 can be increased. It is to be noted that, FIG. 4 illustrates a case where an edge, close to the peripheral region 11, of the orthographic projection of the power supply bus 22 on the base substrate 1 has a wave shape, however, an edge, close to the AA region 12, of the orthographic projection of the power supply bus 22 on the base substrate 1 may also have a wave shape, that is, the edge close to the peripheral region 11 and/or the edge close to the AA region 12, of the orthographic projection of the power supply bus 22 on the base substrate 1 have a wave shape.

In order to further increase the attaching force between the power supply bus 22 and the encapsulation layer 3, further, a surface of the power supply bus 22 in contact with the encapsulation layer 3 is at least partly a curved surface. FIGS. 6a to 6b are schematic cross-sectional views of the power supply bus taken along line b-b' in FIG. 4. Optionally, as shown in FIG. 6a, a surface of the power supply bus 22 in contact with the encapsulation layer 3 includes a second curved surface 14, and specifically, the second curved surface 14 is curved inwardly, that is, the second curved surface 14 is depressed towards a direction away from the encapsulation layer 3. As such, when coating a material of the encapsulation layer, the material of the encapsulation layer can remain at the position of the second curved surface 14, thereby further increasing the attaching force between the encapsulation layer 3 and the power supply bus 22. It is to be noted that, the cross section of the power supply bus 22 taken along line b-b' may also be as shown in FIG. 6b, the surface of the power supply bus 22 in contact with the encapsulation layer 3 is entirely a curved surface, and this curved surface protrudes towards a direction approaching the encapsulation layer 3.

Other structures of the display panel of the present embodiment are the same as those of the display panel of the above-described embodiments, which are not described in detail here.

In the display panel of the present embodiment, since the second protrusion and/or the second hollowed-out part 221 are provided on the power supply bus 22, at the position(s) of the second protrusion and/or the second hollowed-out part 221, the contact area of the power supply bus 22 and the encapsulation layer 3 can be further increased, increasing the attaching force therebetween, preventing cracking of film layers. Furthermore, because the orthographic projection of the power supply bus 22 on the base substrate 1 at least partly has a nonlinear shape, an attaching force between the power supply bus 22 and the encapsulation layer 3 can be increased. Moreover, an edge, close to the peripheral region 11, of the orthographic projection of the power supply bus 22 on the base substrate 1 has a nonlinear line irregular shape, which can increase a contact area between the power supply bus 22 and the encapsulation layer 3, making the power supply bus 22 and the encapsulation layer 3 more firmly connected.

An embodiment of the present disclosure provides a display device, the display device including the display panel according to any one of the above-described embodiments, and specific structures of the display panel are not repeated herein.

In an embodiment of the present disclosure, a type of the display panel is not limited, for example, the display panel may be an OLED display panel or a QLED display panel.

The display device according to the present disclosure includes a display panel, and the display panel includes the power supply wiring layer 2 formed on the base substrate 1, and the encapsulation layer 3 disposed at a side of the power supply wiring layer 2 distal to the base substrate 1, the power supply wiring layer 2 includes the power supply bonding wire 21, which is located in the peripheral region 11 of the display panel and at least partially overlaps with the encapsulation layer 3, an orthographic projection, on the base substrate 1, of a part of the power supply bonding wire 21 overlapping with the encapsulation layer 3 has an edge at least partly having a nonlinear shape. As such, in the process of encapsulating the display panel, a contact area between the encapsulation layer 3 and the power supply bonding wire 21 can be increased, and an attaching force therebetween can be increased, preventing display defect caused by cracking of film layers and falling off of the encapsulation layer 3 during bending of the display panel.

The display device may be any product or component having a display function, such as an electronic paper, a mobile phone, a tablet computer, a monitor, a laptop computer, a digital photo frame, a navigator and the like.

It should be understood that, the above embodiments are only exemplary embodiments for the purpose of explaining the principle of the present disclosure, but the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A display panel, comprising: a power supply wiring layer on a base substrate and an encapsulation layer on a side of the power supply wiring layer distal to the base substrate, wherein the power supply wiring layer and the encapsulation layer at least partially overlap, and a part of the power supply wiring layer overlapping with the encapsulation layer has an irregular structure for increasing a contact area between the power supply wiring layer and the encapsulation layer, wherein the power supply wiring layer comprises a power supply bonding wire in a peripheral region of the display panel, the power supply bonding wire at least partially overlaps with the encapsulation layer, an orthographic projection, on the base substrate, of a part of the power supply bonding wire overlapping with the encapsulation layer has an outline at least partly having a nonlinear shape, and an orthographic projection, on the base substrate, of a part of the power supply bonding wire not overlapping with the encapsulation layer has an outline at least partly having a nonlinear shape.

2. The display panel according to claim 1, wherein the power supply wiring layer further comprises a power supply bus in a peripheral region of the display panel and overlapping with the encapsulation layer, and an outline of an orthographic projection of the power supply bus on the base substrate at least partly has a nonlinear shape.

3. The display panel according to claim 2, wherein the nonlinear shape comprises one or any combination of an arc shape, a fold-line shape, and a wave shape.

4. The display panel according to claim 3, wherein an outline, close to the peripheral region of the display panel, of the orthographic projection of the power supply bus on the base substrate has a wave shape; and/or an outline, close to a display region of the display panel, of the orthographic projection of the power supply bus on the base substrate has a wave shape.

5. The display panel according to claim 2, wherein the power supply bus comprises at least one of: a second protrusion on a side of the power supply bus facing the encapsulation layer; and a second hollowed-out part in the power supply bus.

6. The display panel according to claim 5, wherein
in a case where the power supply bus comprises the second protrusion, an orthographic projection of the second protrusion on the base substrate has one of: a circular shape, an elliptical shape, a square shape, a rectangular shape, and a diamond shape; and
in a case where the power supply bus comprises the second hollowed-out part, the second hollowed-out part has one of: a circular shape, an elliptical shape, a square shape, a rectangular shape, and a diamond shape.

7. The display panel according to claim 5, wherein
in a case where the power supply bus comprises only the second protrusion, the power supply bus comprises a plurality of second protrusions and the plurality of second protrusions are uniformly distributed;
in a case where the power supply bus comprises only the second hollowed-out part, the power supply bus comprises a plurality of second hollowed-out parts and the plurality of second hollowed-out parts are uniformly distributed; and
in a case where the power supply bus comprises the second protrusion and the second hollowed-out part, the second protrusion and the second hollowed-out part are uniformly distributed.

8. The display panel according to claim 5, wherein in a case where the power supply bus comprises the second protrusion, the second protrusion and the power supply bus are formed of a same material.

9. The display panel according to claim 2, wherein a surface of the power supply bus in contact with the encapsulation layer is at least partly a curved surface.

10. The display panel according to claim 1, wherein the nonlinear shape comprises one or any combination of an arc shape, a fold-line shape, and a wave shape.

11. The display panel according to claim 1, wherein the power supply bonding wire comprises at least one of: a first protrusion on a side of the power supply bonding wire facing the encapsulation layer; and a first hollowed-out part in the power supply bonding wire.

12. The display panel according to claim 11, wherein
in a case where the power supply bonding wire comprises the first protrusion, an orthographic projection of the first protrusion on the base substrate has one of: a circular shape, an elliptical shape, a square shape, a rectangular shape, and a diamond shape; and
in a case where the power supply bonding wire comprises the first hollowed-out part, an orthographic projection of the first hollowed-out part on the base substrate has one of: a circular shape, an elliptical shape, a square shape, a rectangular shape, and a diamond shape.

13. The display panel according to claim 11, wherein
in a case where the power supply bonding wire comprises only the first protrusion, the power supply bonding wire comprises a plurality of first protrusions and the plurality of first protrusions are uniformly distributed;
in a case where the power supply bonding wire comprises only the first hollowed-out part, the power supply bonding wire comprises a plurality of first hollowed-out parts and the plurality of first hollowed-out parts are uniformly distributed; and
in a case where the power supply bonding wire comprises the first protrusion and the first hollowed-out part, the first protrusion and the first hollowed-out part are uniformly distributed.

14. The display panel according to claim 11, wherein in a case where the power supply bonding wire comprises the first protrusion, the first protrusion and the power supply bonding wire are formed of a same material.

15. The display panel according to claim 1, wherein a surface of the power supply bonding wire in contact with the encapsulation layer is at least partly a curved surface.

16. The display panel according to claim 1, wherein an entirety of an outline of an orthographic projection of the power supply bonding wire on the base substrate has a continuous nonlinear shape.

17. The display panel according to claim 1, wherein the power supply wiring layer further comprises a power supply wire in a display region of the display panel and overlapping with the encapsulation layer, and a third hollowed-out part is provided in the power supply wire.

18. A display device, comprising the display panel according to claim 1.

19. The display device according to claim 18, wherein the display panel is an organic light emitting diode display panel or a quantum dot light emitting diode display panel.

20. The display panel according to claim 1, wherein the irregular structure comprises at least one of a protrusion on a side of the power supply wiring layer facing the encapsulation layer; and a hollowed-out part in the power supply wiring layer.

* * * * *